United States Patent
Cole et al.

(10) Patent No.: US 7,297,626 B1
(45) Date of Patent: Nov. 20, 2007

(54) PROCESS FOR NICKEL SILICIDE OHMIC CONTACTS TO N-SIC

(75) Inventors: Melanie W. Cole, Churchville, MD (US); Timothy P. Weihs, Baltimore, MD (US)

(73) Assignee: United States of America as Represented by the Secretary of the Army, Washington, DC (US)

(*) Notice: Subject to any disclaimer, the term of this patent is extended or adjusted under 35 U.S.C. 154(b) by 42 days.

(21) Appl. No.: 11/356,065

(22) Filed: Feb. 17, 2006

Related U.S. Application Data

(60) Continuation-in-part of application No. 10/884,580, filed on Jul. 6, 2004, now Pat. No. 7,163,882, which is a division of application No. 09/939,420, filed on Aug. 27, 2001, now Pat. No. 6,759,683.

(51) Int. Cl.
*H01L 21/3205* (2006.01)
*H01L 21/28* (2006.01)

(52) U.S. Cl. .................. 438/602; 438/597; 438/655; 438/660; 438/682; 257/77; 257/E29.143; 257/E21.054

(58) Field of Classification Search ............... 438/602, 438/597, 655, 664, 663, 660, 682; 257/77; 257/E29.143, E21.054
See application file for complete search history.

(56) References Cited

U.S. PATENT DOCUMENTS

| 4,554,045 A | 11/1985 | Bean et al. |
| 5,075,243 A | 12/1991 | Nieh et al. |
| 5,415,829 A * | 5/1995 | Ohhashi et al. ............... 419/23 |
| 5,502,003 A | 3/1996 | Ogino et al. |
| 5,504,041 A * | 4/1996 | Summerfelt ................ 438/396 |

(Continued)

FOREIGN PATENT DOCUMENTS

DE        198 11 046       11/1998

(Continued)

OTHER PUBLICATIONS

Crofton, J. et al., "The Physics of Ohmic Contacts to SiC," Phys. Stat. Sol. (b) 202, 581-603, 1997.

(Continued)

*Primary Examiner*—Michelle Estrada
*Assistant Examiner*—Nicholas J. Tobergte
(74) *Attorney, Agent, or Firm*—William V. Adams

(57) ABSTRACT

A $Ni_2Si$-nSiC Ohmic contact is formed by pulsed laser ablation deposition (PLD) of $Ni_2Si$ source target deposited on a n-SiC substrate or SiC substrate wafer with SiC epilayer. The $Ni_2Si$ Ohmic contact on n-SiC was rapid thermal annealed at 950° C. for 30 s in a $N_2$ ambient. The resultant Ohmic contact is characterized by excellent current-voltage (I-V) characteristics, an abrupt void free contact-SiC interface, retention of the PLD as-deposited contact layer width, smooth surface morphology, and absence of residual carbon within the contact layer or at the interface. The detrimental effects of contact delamination due to stress associated with interfacial voiding; and wire bond failure, non-uniformity of current flow and SiC polytype alteration due to extreme surface roughness; have been eliminated as has electrical instability associated with carbon inclusions at the contact-SiC interface, after prolonged high temperature and power device operation.

14 Claims, 9 Drawing Sheets

U.S. PATENT DOCUMENTS

| | | |
|---|---|---|
| 5,652,437 A | 7/1997 | Harris |
| 5,877,077 A | 3/1999 | Kronlund |
| 5,929,523 A | 7/1999 | Parsons |
| 6,110,813 A | 8/2000 | Ota et al. |
| 6,139,624 A | 10/2000 | Rupp |
| 6,150,246 A | 11/2000 | Parsons |
| 2001/0039105 A1 | 11/2001 | Rupp et al. |
| 2002/0125482 A1 | 9/2002 | Friedrichs et al. |

FOREIGN PATENT DOCUMENTS

| | | |
|---|---|---|
| DE | 198 27 925 | 1/1999 |
| DE | 199 19 905 | 11/2000 |
| WO | WO 97/26678 | 7/1997 |

OTHER PUBLICATIONS

Marinova, Ts. et al., "Nickel Based Ohmic Contacts on Sic," Materials Science and Engineering B46, 223-226, 1997.

Pécz, B., "Contact Formation in SiC Devices," Applied Surface Science 184, 287-294, 2001.

Bächli, A. et al., "Nickel Film on (001) SiC: Thermally Induced Reactions" Materials Science and Engineering B56, 11-23, 1998.

Bozack, M. J., "Surface Studies on SiC as Related to Contacts," Phys. Stat. Sol. (B) 202, 549-580, 1997.

Pai, C. S. et al., "X-ray Diffraction and Ion Backscattering Study of Thermally Annealed Pd/SiC and Ni/SiC," J. Appl. Phys. 57(2), 618-619, 1985.

Kurimoto, E. et al., "Raman Study on the Ni/SiC Interface Reaction," J. Appl. Phys. 91, 12, 10215-10217, 2002.

Marinova, Ts. et al., "Interface Chemistry and Electric Characterisation of Nickel Metallisation on 6H-SiC," Applied Surface Science 99, 119-125, 1996.

\* cited by examiner

PROCESS FOR NICKEL SILICIDE OHMIC CONTACTS TO N-SIC

CROSS REFERENCE TO RELATED APPLICATION

This application is a continuation-in-part of U.S. patent application Ser. No. 10/884,580 filed Jul. 6, 2004, now U.S. Pat. No. 7,163,882 which was a Division of U.S. patent application Ser. No. 09/939,420 filed Aug. 27, 2001 now U.S. Pat. No. 6,759,683.

STATEMENT OF GOVERNMENT INTEREST

The invention described herein may be manufactured and used by or for the Government of the United States of America for Governmental purposes without payment of any royalties thereon or therefore.

BACKGROUND OF THE INVENTION

1. Field of the Invention

The invention relates to a semiconductor device manufacturing process. More particularly, the invention is a process for forming an Ohmic contact on a wide bandgap semiconductor material (SiC). More particularly, the invention is a process for forming a nickel silicide ($Ni_2Si$) Ohmic contact to n-type SiC.

2. Discussion of the Related Art

The invention relates to the technology of manufacturing a SiC based semiconductor device. All semiconductor devices require high quality, low resistivity thermally stable reliable n- and p-type Ohmic contacts. Ohmic contacts are essential for the transfer of signals between the SiC device and the external circuitry. Ohmic contact metallization design, selection and method of deposition heavily influence the electrical and physical properties of Ohmic contacts to all semiconductors. There are many metallization designs; however, the most common used in SiC device technology consists of single layer, bilayer, multilayer composite metallization schemes and compound intermetallics. Low resistance Ohmic contacts to n-type SiC can be obtained by depositing metallizations with appropriate work functions to achieve a barrier height reduction at the metal-SiC interface. The barrier heights of various contacts depend on the surface properties and electron affinity of the semiconductor, and the work function of the metal. For SiC, barrier heights do not follow the Schottky Mott theory and are typically constrained to high values. In practice, the degree of dependence of barrier height on choice of metal has been determined to be dependent on the bulk semiconductor properties, the nature of the surface before contact formation and the interfacial chemistry. At practical SiC interfaces, interface states cause Fermi level pinning which results in the formation of a potential barrier. The interface states affect the charge transfer between the metal and the SiC, hence control the Schottky barrier height.

Metal deposition can be achieved by a variety of methods; the most common being electron-beam (e-beam) evaporation, sputtering, and thermal evaporation. Sputtering and e-beam evaporation is preferred over thermal evaporation for Ohmic contact metal deposition. The reason for this centers on the fact that thermal evaporation methods involve either a resistance-heated source (refractory metal coiled into a filament) or an evaporation source that is heated by rf induction (utilizing a BN crucible) which results in contamination of the charge from the heater or crucible. This contamination leads to unwanted impurities which adversely affect the electrical properties of the condensed Ohmic contact metal film. The method of metal deposition heavily influences the grain size, uniformity, and metal-epilayer interface properties of the condensed contact film. Grain boundaries serves as diffusion pathways, thus minimization of grain boundary area is desirable to control unwanted elemental diffusion. For the same metal deposited by sputtering and e-beam evaporation, the e-beam evaporated films will possess a much larger grain size, which translates to less grain boundary area and lower diffusion pathways. Additionally, larger grain metal films possess higher hardness values which influence the overall mechanical durability of the metal film. E-beam evaporated metal films also have less gas incorporation in the condensed films than sputtered metal films, and as a result have a higher level of film purity. However, the film-substrate adhesion is usually enhanced for sputtered films since the condensing atoms have higher energy with respect to e-beam deposited films. Both e-beam and sputter deposition produce large area uniform films. The method of metal deposition is often determined by the choice of metal to be deposited, for example, since refractory metals are not easily deposited via e-beam evaporation, sputter deposition is preferred. Additionally, the metal deposition method is usually a strong function of equipment availability.

Deposition of an intermetallic Ohmic contact such as $X_2Y$ can be accomplished by sequential e-beam evaporation of each component layer (X and Y) separately with the correct thickness so as to achieve the correct stoichiometric ratio of 2X:1Y followed by a post metal deposition annealing step to achieve the uniform intermetallic phase, $X_2Y$. Alternatively, the intermetallic phase $X_2Y$ can be produced by the sequential co-sputtering of two source targets (target #1 is composition X and target #2 is composition Y) such that two layers, X and Y, are deposited with the proper thickness and post metal deposition annealed in order to achieve the uniform intermetallic phase $X_2Y$ with the correct stoichiometric composition 2X:1Y. A single compound target with composition $X_2Y$ can also be sputter deposited onto the SiC substrate or SiC substrate with SiC epilayer, however the proper 2X:1Y stoichiometry is not easily achieved via this deposition technique. The physical vapor deposition technique, pulsed laser ablation deposition (PLD) has been extensively employed for the preparation/deposition of high quality thin films of multi-component metal-oxide ceramics. The principle desirable feature of PLD is that it is a non-equilibrium evaporation process which produces an intense plasma plume and transfers the target composition/stoichiometry (particularly metallic constituents in the multi-component systems) into the deposited film on a substrate. Thus, PLD is an excellent method for depositing an intermetallic phase $X_2Y$ ($Ni_2Si$) onto a substrate (n-SiC) or SiC substrate with SiC epilayer where precise stoichiometric composition is necessary to achieve a highly conductive low resistivity metal film for Ohmic contact formation (such as $Ni_2Si$-n-SiC).

Post metal deposition annealing is usually required to achieve Ohmic behavior in the deposited metal films on SiC. Annealing of metal contact-SiC structures has been achieved via conventional furnace annealing (CFA) and rapid thermal annealing (RTA). The choice of ambient annealing gas influences the electrical properties of Ohmic contact significantly. For CFA, the ambient atmosphere can range from vacuum annealing where metal oxidation is an issue, to flowing $N_2$, Ar, and forming gas. The most common RTA ambient gases are $N_2$, Ar, and forming gas. CFA requires longer processing times with respect to RTA and thus often enhances unwanted elemental diffusion. For annealing some contact metals to SiC the thermally induced interfacial reactions which are responsible for Ohmic behavior demand narrow time-temperature process windows, thus favoring rapid thermal processing. Specifically, RTA is a fast thermal processing method, 1-100 sec, which provides the advantages of (a) reduced thermal budget (anneal temperature× anneal time), and (b) rapid heating and cooling rates in the range of 30-500° C./sec. These advantages are critical to the formation of good Ohmic contacts since the desired interfacial phase formation usually occurs at some temperature ($T_1$) for a time ($t_1$), after which the processing temperature can be reduced rapidly by as much as 50° C. in 1 sec. Thus, undesired contact metal-SiC phase formation/phenomena having different activation energy than the desired contact metal-SiC phase formation are almost completely suppressed since only a fraction of a second would be available for the undesirable process or phase formation. The most common annealing method for SiC contact technology is RTA, but again, like metal deposition methods, the annealing mode is often a function of equipment availability.

Optimum contact performance is not only influenced by the material processing and design elements described above, but also relies on strict adherence to a set of fundamental contact-semiconductor requirements. Currently, there are several critical requirements for Ohmic contacts which must be satisfied in order to achieve high performance reliable SiC based devices. The most prominent of these is the attainment of a reproducible low specific contact resistance value. Additionally, the Ohmic contact must not significantly perturb device performance. In other words, the contact must supply the required current density with a voltage drop that is significantly small compared with the drop across the active region of the device. The contact must also possess good mechanical properties, that is, good metal adhesion during formation, subsequent processing and in service device operation. The metallization must not cause excessive stress in the underlying semiconductor since this can result in alteration of electronic characteristics. The Ohmic contact must be temporally and thermally stable. Additionally, the Ohmic contact must be environmentally stable under prolonged bias-temperature stress, humidity, and reactive ambient conditions. The contact metal-semiconductor interface must be uniform, shallow, and abrupt. In the case of alloyed contacts, the metal-semiconductor interface phase(s) must be laterally homogenous. This uniformity of metal-semiconductor interfacial reactions serves to minimize the spread in contact resistance values, suppress current nonuniformity and improve device reliability. The metallization must have a smooth surface morphology, which is critical for device wire bonding. Fabrication of the Ohmic contacts must be controllable and reproducible, that is, reactions and other properties which govern the contact resistance must be reproducible and the contact fabrication must be compatible with semiconductor processing. Finally, the drive towards lower contact processing temperatures should be adhered to whenever possible. This is critical for device integration issues, namely, integration of materials with differing thermal stability within a single device (heterostructures) and/or integration of several devices, composed of different materials, on a common substrate.

SUMMARY OF THE INVENTION

A nickel silicide ($Ni_2Si$) Ohmic contact is formed on n-type silicon carbide (n-SiC) semiconductor substrate or n-SiC substrate with SiC epilayer by means of a pulsed laser ablation deposition process.

A SiC substrate or n-SiC substrate with SiC epilayer is optionally masked to expose the required deposition area(s). The SiC substrate or n-SiC substrate with SiC epilayer is mounted in a vacuum chamber (preferred base pressure of <$1.0 \times 10^{-6}$ Torr) in the substrate/sample position. A source nickel silicide target has the chemical composition $Ni_2Si$ and is 99.9% pure. The source $Ni_2Si$ target is mounted in a vacuum chamber in close proximity to the sample substrate and separated from the target by a gap. The preferred gap distance is 10 cm.

A laser beam is focused onto the rotating source target with a 45° incident angle. The source target $Ni_2Si$ is then ablated by a laser beam (preferred laser fluence 10 $Jcm^{-2}$) to produce a $Ni_2Si$ plume that is the deposited on the SiC substrate or n-SiC substrate with SiC epilayer (substrate is not heated). The preferred amount is a 200-400 nanometer thick $Ni_2Si$ layer on the SiC substrate or n-SiC substrate with SiC epilayer.

The result is a $Ni_2Si$ Ohmic contact having the same stoichiometric composition as the source target. In order to dissolve the native oxide, which is present at the interface between the $Ni_2Si$ contact metallization and the SiC substrate or n-SiC substrate with SiC epilayer, a post deposition anneal at 950° C. for 30 s (via rapid thermal annealing (RTA)) is performed in a $N_2$ ambient. Thus the $Ni_2Si$—SiC Ohmic contact is formed.

DETAILED DESCRIPTION OF THE INVENTION

Figures 1A, 1B, 1C:
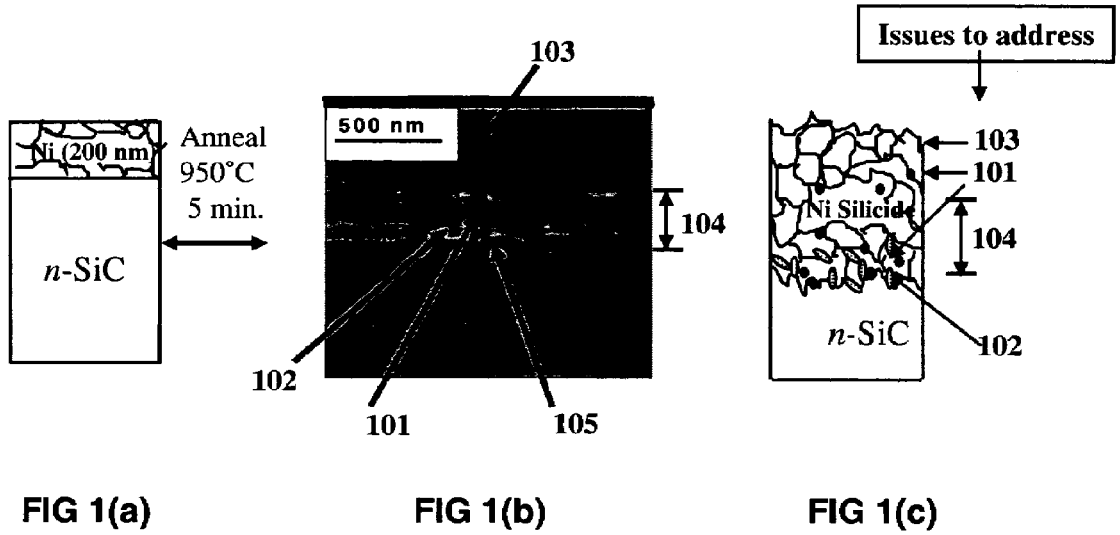
FIG. 1. Ni-contact to n-SiC. (a) Schematic diagram of the e-beam as-deposited Ni on n-SiC; (b) Scanning electron microscopy (SEM) micrograph of the Ni—SiC after annealing at 950° C. for 2-5 min showing interfacial voiding, unreacted carbon, broad interface/significant expansion of the contact layer, and extreme surface roughness; (c) Schematic representation of the annealed Ni—SiC Ohmic contact with the reliability issues highlighted.

SiC is an excellent candidate for high temperature and high power device applications because of its combination of electronic and thermal properties, namely, wide energy bandgap, high electric breakdown field, large saturated electron drift velocity and high thermal conductivity. Based on these properties, devices fabricated from SiC promise superior performance to that of present day devices. Rapid advances in the growth, doping, and processing of SiC have led to the realization of several electronic and photonic devices including fast recovery high voltage diodes, metal oxide semiconductor field effect transistors (MOSFETs), metal semiconductor field effect transistors (MESFETs), static induction transistors (SITs), junction field effect transistors (JFETs), UV photodiodes, and SiC bipolar devices, bipolar junction transistors (BJTs) and hybrid bipolar transistors (HBTs). The wide bandgap and high thermal conductivity are attractive for high temperature digital integrated circuits and nonvolatile solid-state memories. Although progress with SiC based electronic devices has been encouraging, there are significant challenges to overcome in the development of physically, chemically, and electrically stable and reliable multilevel metallization technology capable of high packing density. An important requirement of all device technologies is the development of electrical contacts with low specific contact resistance and high stability and long term reliability. Ohmic contacts with low specific contact resistance and good thermal stability are necessary to obtain optimum performance from high temperature, high power, and high frequency devices. As the device dimensions continue to decrease, much more stringent requirements are being placed on the material, processing, and electrical performance of low resistance Ohmic contacts. Metallization of wide bandgap semiconductors (SiC) is complicated, particularly because of their high surface reactivity, low doping concentrations, and high density of interface states.

Nickel Ohmic contacts are deemed the industry standard contacts for SiC devices. Nickel Ohmic contacts to n-SiC possess a low specific contact resistance ($\rho_c$) less than $5.0\times10^{-5}$ $\Omega$-cm$^2$, and good physical thermal stability at temperatures up to 500° C. for ~100 h. In addition, from the point of electrical integrity, nickel Ohmic contacts to n-SiC are reproducible.

It is known that Ni-nSiC Ohmic contacts are formed by depositing pure metallic nickel on the n-SiC substrate or n-SiC substrate with SiC epilayer. This intermediate (Ni—SiC) is then furnace annealed at temperatures of about 950° C. for 2 to 5 minutes or rapid thermal annealed (RTA) at temperatures of about 950° to 1000° C. for 30 s-60 s. Annealing results in the formation of the intermetallic phase Ni-silicide (N$_2$Si) overlying the SiC substrate or n-SiC substrate with SiC epilayer material. The resulting Ohmic contact composition is represented by the chemical formula Ni$_2$Si—SiC. Formation of Ni$_2$Si by annealing Ni—SiC at 950° C. to 1000° C. has been reported to cause a lower resistance of the initial Ni—SiC contact. Therefore, it is actually this Ni$_2$Si—SiC composition and not pure Ni intermediate contact that displays the low specific contact resistance reported above.

It has been reported that the high temperature annealing process used to form this Ni$_2$Si—SiC Ohmic contacts results in several undesirable features which cause device reliability issues and ultimate device failure. These features include:

Substantial broadening of the contact layer thickness or metal-SiC interface expansion. The increase in contact thickness via consumption of the SiC substrate or n-SiC substrate with SiC epilayer is due to the high reactivity of Ni with Si to form Ni-silicide leaving behind both voids and unreacted carbon. Annealing the Ni—SiC contact results in a contact thickness increase of $\geq100\%$. Such an increase in contact thickness makes the annealed Ni—SiC Ohmic contact not useable for device designs which posses shallow p-n junctions.

A rough interface morphology heavily laden with Kirkendall voids. The voids, (resulting from the high reactivity of Ni with Si) at the interface will cause internal stress and possible delamination of the contact layer, which will compromise device reliability. The internal stress and contact delamination will be significantly amplified under the extreme thermal and electrical stresses typical of the power device operational environment and will ultimately result in device failure. The rough interface morphology makes the annealed Ni—SiC Ohmic contact not useable for device designs which posses shallow p-n junctions. Thus loss of a sharp interface will compromise device designs which possess shallow p-n junctions.

Carbon segregation at the metal-SiC interface and/or throughout the metal layer. It is known, via x-ray photoelectron spectroscopy (XPS) analyses of the annealed contact, that carbon is in the graphite state and that Si is bonded predominantly to Ni resulting in Ni-silicide formation. Dissociation of SiC, to Si and C in the presence of Ni atoms is possible at temperatures above 400° C. Thus, the dissociation of SiC at the Ni/SiC interface to Si and C is due to the reactivity of Ni. Carbon inclusions at the metal-SiC interface and/or within the contact layer are considered a potential source of electrical instability, especially after prolonged operation of the devices at high temperatures. At elevated temperatures redistribution of carbon inclusions will arise, resulting in significant degradation of the contact's electrical and microstructural properties.

Substantial roughening of the contact surface (on the order of tens of nanometers). For many device applications Ohmic contacts must be wire bonded to a die package. A rough surface morphology will most likely cause wire bonding difficulty and/or failure under the extreme thermal fatigue during high power and high temperature device operation. Additionally, rough surface morphology is not desirable for high current applications because it causes non-uniformity of current flow. In addition, contact surface roughness results in residual material stresses that may induce SiC polytype changes. Alteration of the SiC polytype also alters the electrical properties. For example, a polytype change from 4H to 6H degrades the electron mobility of the SiC and degrades the device.

Therefore, even though Ni contacts possess excellent electrical properties, the above mentioned features will lead to device reliability problems and ultimately cause device failure via contact degradation and/or wire bond failure after exposure to long term high power and high temperature device operational stresses. FIG. 1(a) displays a cross sectional view schematic of the e-beam as-deposited Ni-nSiC Ohmic contact. A cross sectional view scanning electron microscopy (SEM) micrograph (showing the above mentioned undesirable features: residual carbon 101, void formation 102, rough surface morphology 103 and 105 and extreme contact broadening or interface broadening 104) of the 950° C. annealed Ni—SiC is displayed in FIG. 1(b). From the data in FIG. 1(b) the inventor constructed a schematic diagram, displayed in FIG. 1(c), of the cross sectional view of the annealed Ni-nSiC Ohmic contact highlighting the above mentioned undesirable features.

All of the above mentioned phenomena have led the inventors to seek a method of forming a Ni$_2$Si-nSiC Ohmic contact in the absence of the undesirable phenomena (residual carbon, void formation, rough surface morphology and extreme contact broadening or interface broadening)

associated with the annealing of pure Ni-nSiC Ohmic contacts. The inventors have fabricated an improved Ohmic contact to n-SiC via direct deposition of the intermetallic phase, $Ni_2Si$, known to be in thermodynamic equilibrium with SiC at high temperatures (900-1000° C.).

Figure 2A:
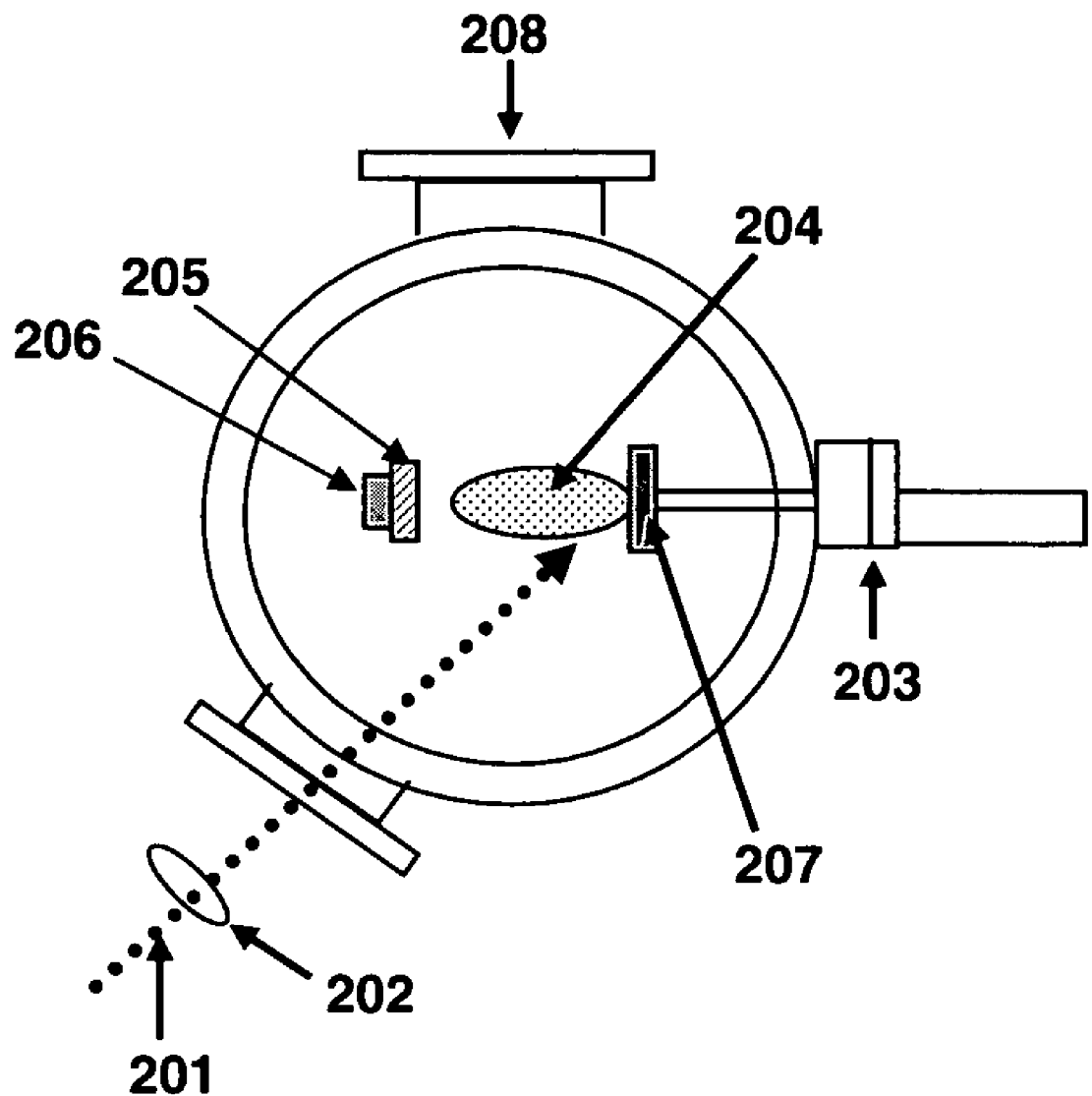
FIG. 2. (a) Schematic diagram of the pulsed laser ablation deposition (PLD) system and processing parameters. (b) nickel silicide ($Ni_2Si$) Ohmic contact to n-type SiC. (c) processing steps.

The $Ni_2Si$ (400 nm) metallization was deposited via pulse laser ablation deposition (PLD) on select grade, Si-face, 8° off-c-axis (0001) 4H n-type ($2.0\times10^{18}$ $cm^{-3}$) SiC wafers. Prior to metal deposition the wafers were cleaned in warm electronic grade trichoroethane (TCA), acetone and methanol followed by a rinse in deionized water. The $Ni_2Si$ metallization was pulse laser ablated from a $Ni_2Si$ (99.9% pure) source target under a base vacuum of less than $1.0\times10^{-6}$ Torr using a Lambda Physik Complex 205 excimer laser (KrF-248 nanometer laser). Depositions were performed with the laser beam 201 focused through focusing lens 202 onto the rotating target 207 at a 45° incident angle. The sample-target separation distance was 10 cm and the laser fluence was 10 $Jcm^{-2}$ with a repetition rate of 50 Hz. The $Ni_2Si$ films were deposited on to an unheated SiC wafer substrate 205 or n-SiC substrate with SiC epilayer also 205. A schematic of the deposition system and processing parameters is displayed in FIGS. 2(a) thru 2(c). The target rotation motor 203 rotates the target 207 causing ablation plume 204 which is deposited on sample 205, which is mounted on sample holder 206. The process can be observed through viewing window 208.

Figure 2B:
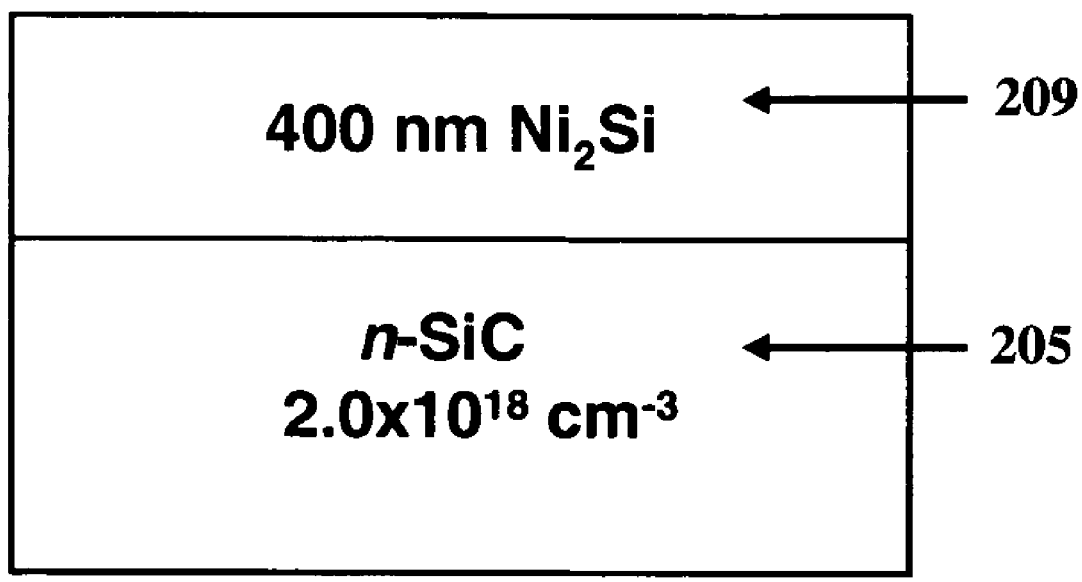
Figure 2C:
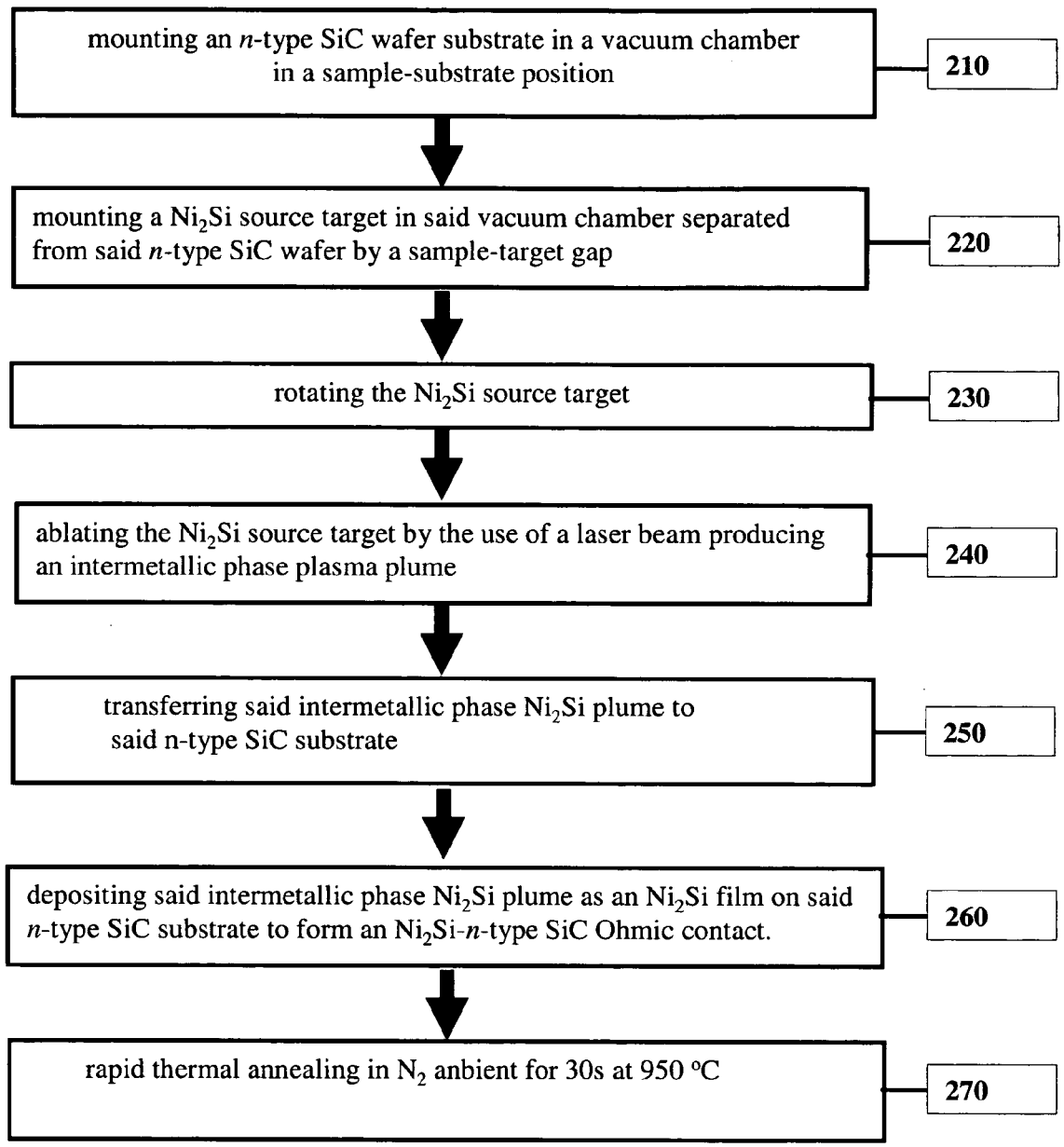

This process is shown in greater detail by a flow diagram showing the individual steps to the deposition/annealing process in FIG. 2(c). Step 210: An n-type SiC wafer substrate 205 is mounted in a vacuum chamber in a sample-substrate position on sample holder 206. Step 220: a $Ni_2Si$ source target 207 is mounted in the vacuum chamber separated from the n-type SiC wafer 205 by a sample-target gap—preferably about 10 cm. Step 230: the $Ni_2Si$ source target 207 is rotated. Step 240: the $Ni_2Si$ source target 207 is ablated by the use of a laser beam 201 producing an intermetallic phase plasma plume 204. Step 250: the intermetallic phase plasma plume 204 is transferred to the n-type SiC wafer substrate 205. Step 260: the intermetallic phase $Ni_2Si$ plume is deposited, as shown in FIG. 2(b), as an $Ni_2Si$ film 209 on the n-type SiC substrate 205 to form an $Ni_2Si$-n-type SiC Ohmic contact. Step 270: the $Ni_2Si$-n-type SiC Ohmic contact undergoes rapid thermal annealing in $N_2$ ambient for 30 s at 950° C.

Subsequent to deposition the $Ni_2Si$—SiC samples were rapid thermally annealed (RTA) in an AG Associates RTA for 30 sec at 700° C. and 950° C. Material characterization was performed on the PLD as-deposited and annealed samples. The contacts electrical quality was evaluated via current voltage characteristics using a HP 4140B semiconductor test system. The contacts composition, thickness, and interface quality was determined via Rutherford backscattering spectroscopy (RBS) analysis with a NEC Pelletron accelerator using a 2 MeV $He^+$ ion beam with a scattering angle of 170° and a solid angle of 5.5 msr. Simulations were produced using the computer code RUMP. The contact structure was analyzed by glancing angle x-ray diffraction (GAXRD) with a Siemens D-5005 powder diffractometer using Cu Kα radiation at 50 kV and 40 mA. Auger electron spectroscopy (AES) was employed to assess elemental distribution within the contact and across the contact-SiC interface. AES analyses were obtained using a Perkin Elmer PH1660 scanning Auger microprobe. A Hitachi S4500 field emission scanning electron microscopy (FESEM) was utilized to assess the contact surface morphology, contact-SiC interface uniformity and film microstructure. DI Tapping mode atomic force microscopy (AFM) was used to quantify the contacts surface roughness.

Figure 3:
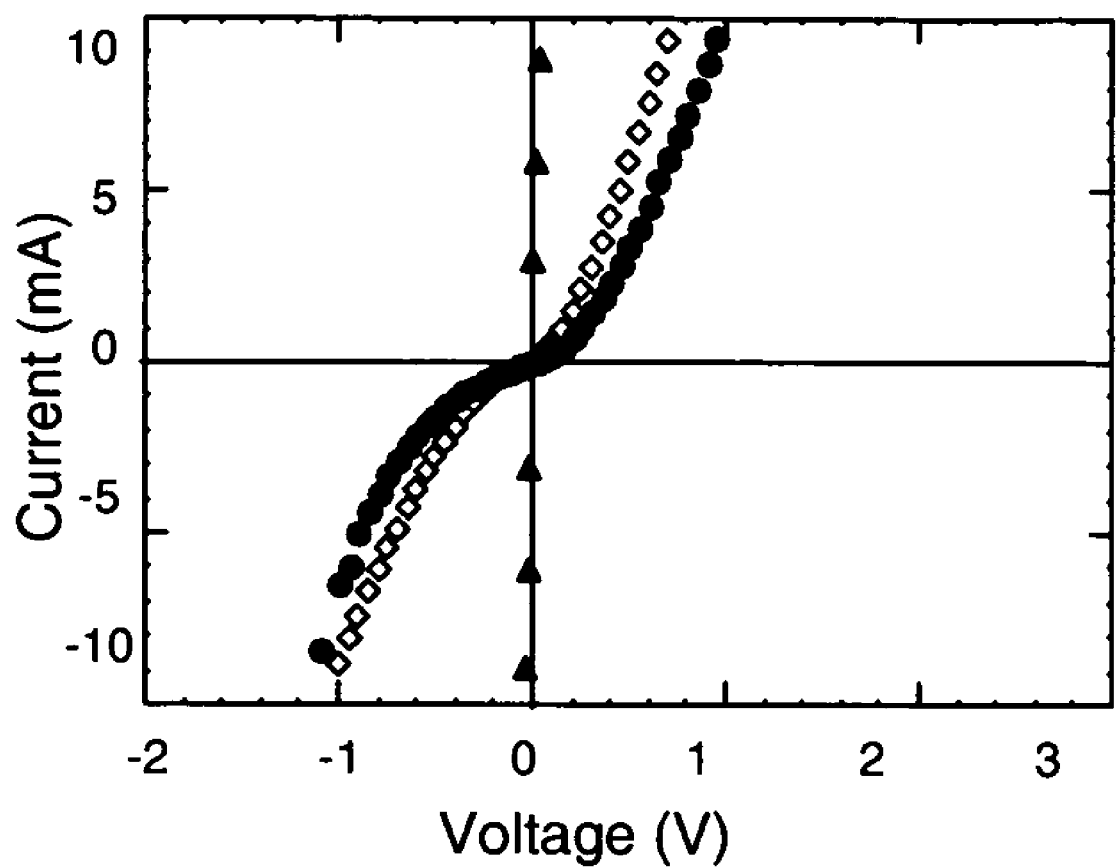
FIG. 3. Current-Voltage (I-V) characteristics of the PLD as-deposited (open diamonds), 700° C. annealed (filled circles), and 950° C. annealed (filled triangles) $Ni_2Si$ contacts to n-SiC.

The electrical, structural, compositional, and interfacial properties of the PLD $Ni_2Si$ Ohmic contacts to n-SiC have been investigated as a function of annealing temperature. The I-V characteristics of the PLD as-deposited and annealed contacts to n-SiC are displayed in FIG. 3. The as-deposited sample exhibited non-Ohmic behavior suggestive of a large barrier height. Annealing at 700° C. caused no improvement in the I-V characteristics. However, annealing at 950° C. resulted in excellent Ohmic behavior as demonstrated by the I-V characteristics which possess linear characteristics with small resistance and is symmetric with reversal of voltage polarity. Thus, annealing at 950° C. significantly enhanced the current conduction through the contacts. The fact that a thermal anneal was required to achieve good Ohmic behavior suggests that some minute reaction must have occurred. Such as interfacial reaction may have eliminated some interfacial contaminants (e.g. thin oxide layer) thereby releasing Fermi level pinning and inducing Ohmic behavior.

Figure 4:
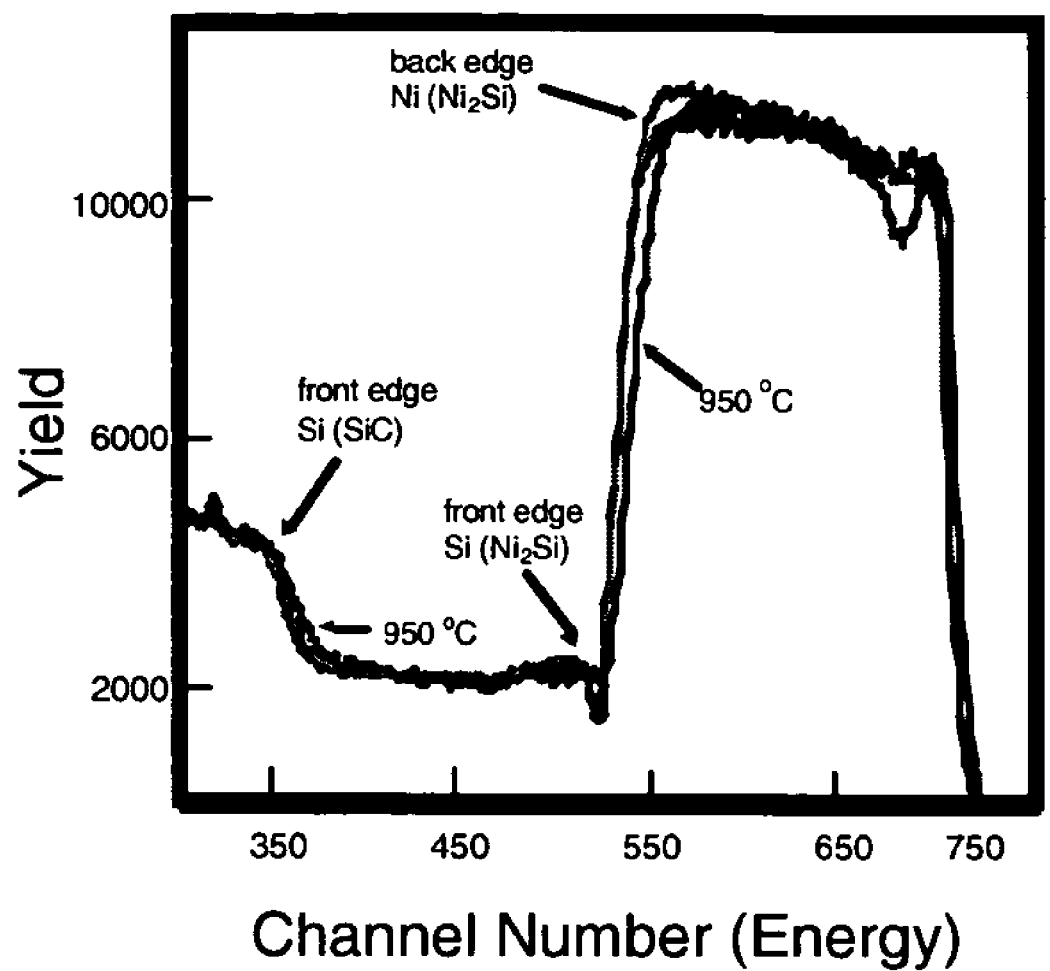
FIG. 4. Rutherford backscattering spectroscopy (RBS) spectra of the PLD as-deposited and annealed $Ni_2Si$—SiC contacts.

In order to assess and understand the contacts electrical characteristics RBS, GAXRD, AES, and FESEM analyses were performed on the PLD as-deposited and annealed contacts. The RBS spectra for the $Ni_2Si$—SiC contacts are displayed in FIG. 4. The surface energies of the film elements are marked by arrows. The high energy edge of the Si signal from the SiC substrate is shifted to lower energies with respect to that of the Si in the $Ni_2Si$ film, because the detected particles that are backscattered there lose energy in the overlying film. From the energy width of the Ni signal the contact thickness was determined to be ~400 nm. The width of the Ni signal is the same for the as-deposited and 700° C. annealed sample, however, the 950° C. sample is slightly thinner as indicated by the higher energy position of the back edge of the Ni signal and front edge of the Si signal in SiC. The thinner film, 950° C. sample, is due to non-uniformity of the PLD process. Slight variations in film thickness across a PLD deposited film are inherent to the deposition technique since PLD maintains uniformity on a scale of ~1×1 $cm^2$. However, since Ohmic contact dimensions are on the scale of 10 s to 100 s of microns this non-uniformity of ~1×1 $cm^2$ is negligible and does not pose an issue for device manufacture. The fact that the back edge of the Ni signal did not shift to lower energies (width of the Ni signal did not increase) as a result of annealing indicates that there is no increase of the vertical dimension of the contact (that is, no broadening of the contact layer or interface expansion) as a result of annealing. The contact-SiC interface quality was assessed by comparing the slopes of the front edge of the Si signal in SiC and the back edge of the back edge of the Ni signal of the as-deposited spectrum with those of the annealed spectra. The slopes of the as-deposited and annealed contacts appear virtually identical, indicating a minimal amount of interaction between the contact and SiC as a result of annealing required for Ohmic contact formation.

Figure 5A:
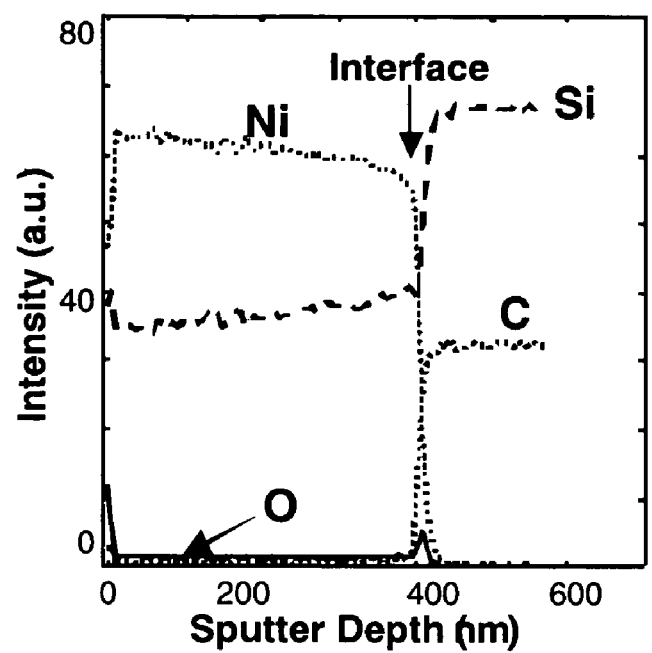
FIG. 5. Auger electron spectroscopy (AES) elemental depth profiles of the PLD (a) as-deposited and (b) 950° C. annealed $Ni_2Si$ contact to n-SiC.
Figure 5B:
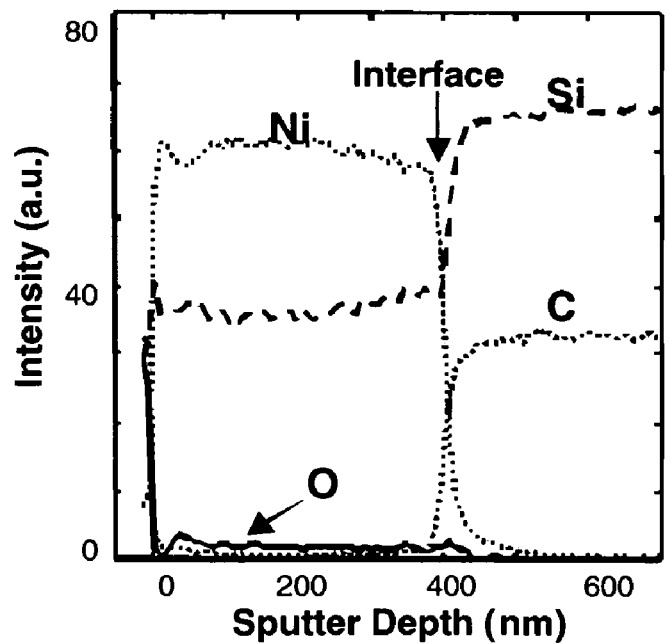

The GAXRD data for the contacts annealed at 700° C. and 950° C. confirmed the presence of the $Ni_2Si$ phase. The AES depth profiles for the as-deposited and 950° C. annealed contacts are displayed in FIGS. 5(a) and 5(b). AES elemental depth profile for the PLD as-deposited sample shows a very sharp interface between the contact metallization and the SiC substrate or n-SiC substrate with SiC epilayer, however, slight oxygen enrichment is observed at the contact-SiC interface. The interfacial oxygen is most likely due to lack of an oxide etch step prior to the metal deposition.

The AES depth profile for the 950° C. annealed sample shows the contact-SiC interface to be chemically abrupt with no interfacial oxygen present or signs of elemental interdiffusion. The high temperature, 950° C., anneal appears to have caused dissolution of the interfacial oxide, which in turn prompted the excellent electrical properties of this contact. The negligible level of the carbon signal within the annealed contact and at the contact-SiC interface indicates that no residual carbon is present within the film or accumulated at the interface as a result of the high temperature annealing process. The absence of residual carbon within the contact metallization is extremely desirable from the standpoint of device reliability. Carbon inclusions at the metal-SiC interface and/or within the contact layer are considered a potential source of electrical instability, especially after prolonged operation of the devices at high temperatures. At elevated temperatures redistribution of carbon inclusions will arise, resulting in significant degradation of the contact's electrical and microstructural properties. Thus, the direct deposition of $Ni_2Si$ served to eliminate carbon accumulation within the film and at the metal-SiC interface.

Figure 6A:
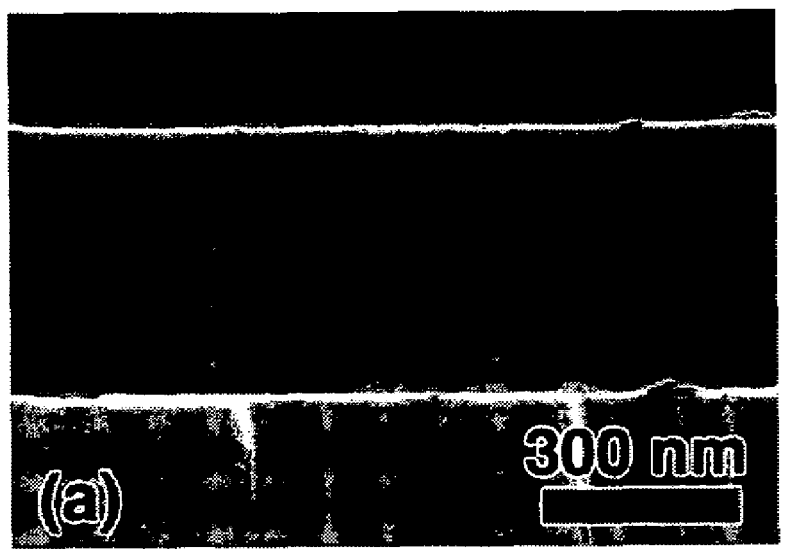
FIG. 6. Cross-sectional field emission scanning electron microscopy (FESEM) micrographs of the PLD (a) as-deposited and (b) 950° C. annealed $Ni_2Si$ Ohmic contacts to n-SiC.
Figure 6B:
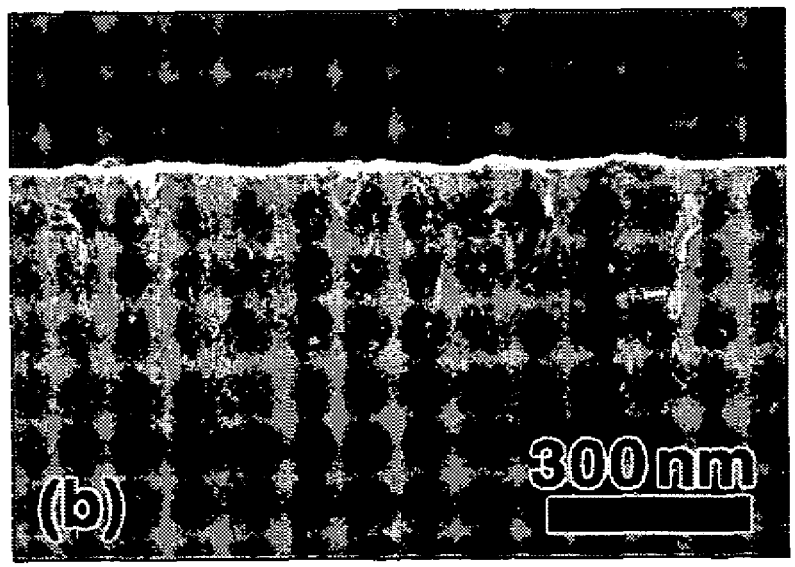

FIG. 6 displays the field emission scanning electron microscopy (FESEM) secondary electron cross-sectional micrographs of the as-deposited and 950° C. annealed contacts to SiC. For both the PLD as-deposited and annealed samples, the metal-SiC interfaces were morphologically abrupt and the contact layer thickness/interface width remained unchanged and uniform over large lateral distances with no evidence of void formation or contact delamination as a result of the annealing process.

Figure 7A:
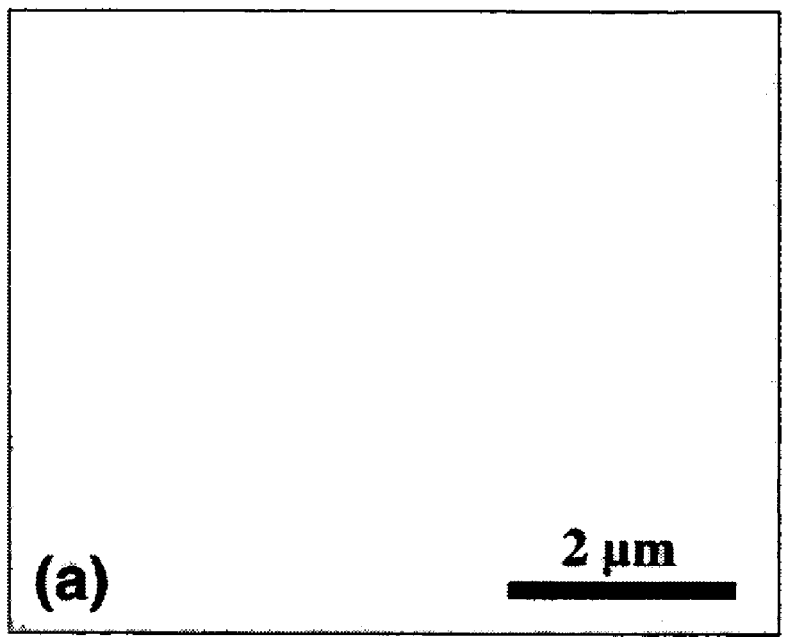
FIG. 7. Plan-view field emission scanning electron microscopy (FESEM) micrographs showing the surface morphology of the PLD (a) as-deposited and (b) 950° C. annealed $Ni_2Si$ Ohmic contacts to n-SiC.
Figure 7B:
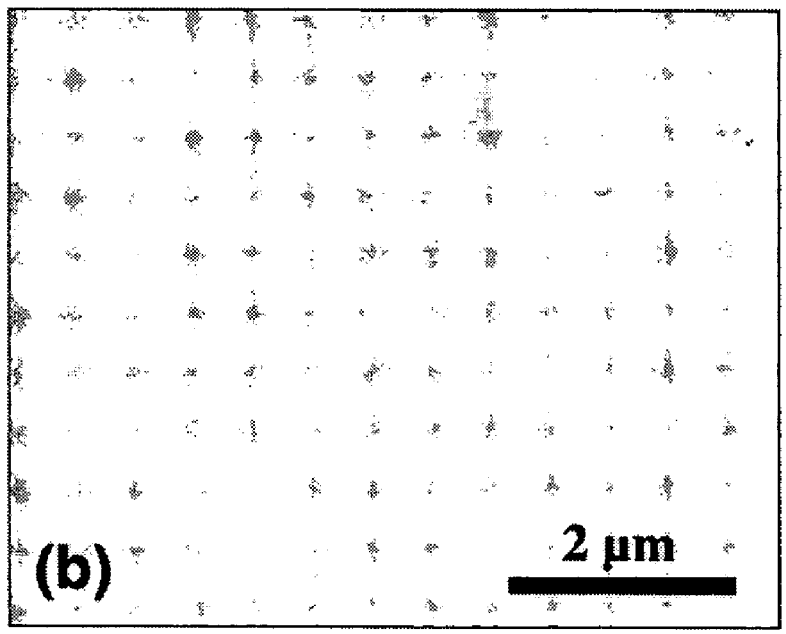

Plan-view field emission scanning electron microscopy (FESEM) micrographs, FIG. 7, of the as-deposited and annealed contacts show the surfaces to be homogenous, smooth, crack and pinhole free. Quantification of the surface roughness was achieved via AFM. The average root mean square roughness values ($R_{rms}$) for the PLD as-deposited and 950° C. annealed contacts were 0.037 nm and 0.067 nm respectively. The extreme surface smoothness of the annealed $Ni_2Si$ contact promotes strong reliable wire bonding and will ensure maintenance of wire-contact mechanical durability during high power and high temperature device operation. In addition, a smooth surface morphology ensures current uniformity and retention of the original SiC polytype with its inherent electrical properties.

The inventors have demonstrated that excellent electrical, and enhanced structural, compositional, and interfacial properties have been achieved by direct deposition, via PLD, of the intermetallic phase, $Ni_2Si$, on n-SiC.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A pulsed laser ablation deposition process for forming at least one low specific contact resistance, ($p_c$) or less than $5.0 \times 10^{-5}$ $\Omega$-$cm^2$, thermally stable Ohmic contact on an n-type SiC substrate comprising:

mounting an n-type SiC wafer substrate or n-SiC substrate with SiC epilayer in a vacuum chamber in a sample-substrate position;

mounting a $Ni_2Si$ source target in said vacuum chamber separated from said n-type SiC wafer or n-SiC substrate with SiC epilayer by a sample-target gap;

rotating the $Ni_2Si$ source target;

ablating the $Ni_2Si$ source target by the use of a laser beam producing an intermetallic phase plasma plume;

transferring said intermetallic phase $Ni_2Si$ plume to said n-type SiC substrate or n-SiC substrate with SiC epilayer;

depositing said intermetallic phase $Ni_2Si$ plume as an $Ni_2Si$ film on said n-type SiC substrate or n-SiC substrate with SiC epilayer to form an $Ni_2Si$-n-type SiC Ohmic contact; and rapid thermally annealing in an $N_2$ ambient for 30 seconds at 950° C.

2. The pulsed laser ablation deposition process of claim 1 wherein the $Ni_2Si$ source target is 99.9% pure.

3. The laser ablation deposition process of claim 2 wherein the Ohmic contact is the same composition and stoichiometry as the 99.9% pure $Ni_2Si$ source target.

4. The pulsed laser ablation deposition process of claim 1 wherein the SiC substrate wafer or n-SiC substrate wafer with SiC epilayer is select grade, Si-face, 8° off-c-axis (0001) 4H n-type ($2.0 \times 10^{18}$ $cm^{-3}$).

5. The pulsed laser ablation deposition process of claim 1 wherein, prior to mounting, the SiC wafer SiC substrate wafer with SiC epilayer is cleaned in warm electronic grade trichloroethane (TCA), acetone and methanol and then rinsed in deionized water.

6. The pulsed laser ablation deposition process of claim 1 wherein ablating is continued until the $Ni_2Si$ film is 200 to 400 nm thick.

7. The pulsed laser ablation deposition process of claim 1 wherein the laser beam is a KrF 248 nm excimer laser beam.

8. The laser ablation deposition process of claim 7 wherein the KrF-248 nm excimer laser beam is under a base pressure of $\leq 10 \times 10^{-6}$ Torr.

9. The laser ablation deposition process of claim 7 wherein the KrF-248 nm excimer laser beam has a laser fluence of 10 $Jcm^{-2}$ and a repetition rate of 50 Hz.

10. The laser ablation deposition process of claim 1 wherein the laser beam is an excimer laser having average pulse energy of 200 to 400 milliJoules at a 20-nanosecond pulse width.

11. The laser ablation deposition process of claim 1 wherein the sample to target gap is 10 cm.

12. The pulsed laser ablation deposition process of claim 1 wherein the laser beam is focused onto the rotating target at a 45° incident angle.

13. The laser ablation deposition process of claim 1 wherein the sample substrate SiC wafer SiC substrate wafer with SiC epilayer is unheated.

14. The laser ablation deposition process of claim 1 wherein after deposition of $Ni_2Si$ the $Ni_2Si$-n-type-SiC is rapid thermally annealed at 950° C. for 30 s in a $N_2$ ambient atmosphere.

* * * * *